United States Patent [19]

Lau et al.

[11] 4,177,084

[45] Dec. 4, 1979

[54] METHOD FOR PRODUCING A LOW DEFECT LAYER OF SILICON-ON-SAPPHIRE WAFER

[75] Inventors: Silvanus S. Lau; James W. Mayer, both of Pasadena, Calif.; Thomas W. Sigmon, Corvallis, Oreg.

[73] Assignee: Hewlett-Packard Company, Palo Alto, Calif., by Thomas W. Sigmon, a part interest

[21] Appl. No.: 913,982

[22] Filed: Jun. 9, 1978

[51] Int. Cl.$^2$ ................. H01L 21/265; H01L 7/00
[52] U.S. Cl. .................... 148/1.5; 148/175; 148/176; 357/91
[58] Field of Search ............. 148/1.5, 175, 174, 176; 357/91

[56] References Cited

U.S. PATENT DOCUMENTS

| | | | |
|---|---|---|---|
| 3,589,949 | 6/1971 | Nelson | 148/1.5 |
| 3,726,719 | 4/1973 | Brack et al. | 148/1.5 |
| 3,900,345 | 8/1975 | Lesk | 148/1.5 |
| 3,909,307 | 8/1975 | Stein | 148/1.5 |
| 3,997,368 | 12/1976 | Petroff et al. | 148/1.5 |
| 4,042,419 | 8/1977 | Heinke et al. | 148/1.5 |

OTHER PUBLICATIONS

Müller et al., ". . . Interfacial Layers . . . Amorphous. . . Si", Appl. Phys. 13 (1977), 255.
Csepregi et al., ". . . Recrystallization . . . Amorphous Si . . .", Phys. Letts., 54a (1975), 157.
Csepregi et al., ". . . Residual Disorder in Implanted . . . Si", Rad. Effects, 28 (1976), 227.
Csepregi et al., "Regrowth . . . Amorphous Layers . . .", Appl. Phys. Letts. 29 (1976), 92.
Dvurechensky et al., "High Dose Effects . . .", Rad. Effects, 30 (1976), 69.
Baker et al., ". . . Imperfections in Si . . . Ion-Implanted Substrate", Jr. Mat. Sc., 10 (1975), 1259.
Light et al., "Stress-Free Hetero-Epitaxial Layers", IBM-TDB, 12 (1970), 1496.
Golanski et al., ". . . Si Bombarded with . . . Si Ions", Radiation Effects, 25 (1975), 213.
Abrahams et al., "Misfit Dislocations in . . . Si on Sapphire", Appl. Phys. Letts. 28 (1976), 275.
Glowinski et al., ". . . Defects in Implanted . . . Si . . .", Appl. Phys. Letts. 28 (1976), 312.

Primary Examiner—L. Dewayne Rutledge
Assistant Examiner—Upendra Roy
Attorney, Agent, or Firm—Ronald E. Grubman

[57] ABSTRACT

A method is provided for producing a low-defect layer of silicon on a sapphire substrate. A silicon-on-sapphire (SOS) wafer is formed by initially epitaxially depositing silicon on the sapphire substrate to form a monocrystalline layer which is substantially free of lattice defects near its surface, but which exhibits a high defect density near the sapphire substrate. The wafer is subsequently subjected to an ion implantation to form an amorphous region in the silicon near the silicon-sapphire interface. The implanted ions are preferably "channeled" through the silicon layer to insure that the amorphous region will be localized in the imperfect region near the substrate, leaving the upper region of the silicon layer undamaged. During a subsequent high temperature anneal cycle, monocrystalline silicon is regrown from the residual upper regions of the silicon down to the silicon-sapphire interface, producing a silicon layer having a greatly reduced defect density throughout the layer.

6 Claims, 4 Drawing Figures

METHOD FOR PRODUCING A LOW DEFECT LAYER OF SILICON-ON-SAPPHIRE WAFER

BACKGROUND OF THE INVENTION

This invention is concerned generally with the semiconductor structure known as silicon-on-sapphire (SOS), and more particularly with a new method for producing a low defect single-crystal silicon layer on a sapphire substrate.

To produce SOS semiconductor wafers on which semiconductor devices can be fabricated a thin monocrystalline silicon layer must be formed on a sapphire substrate. In the prior art different types of epitaxial deposition have been used to produce the silicon layer. However, because of a mismatch in lattice spacing between the crystalline silicon and the sapphire substrate, silicon which has been grown on sapphire has exhibited a lattice defect density considerably higher than that of pure bulk silicon. The defect density tends to be particularly high near the silicon-sapphire interface.

In U.S. Pat. No. 3,900,345, titled THIN LOW TEMPERATURE EPI REGIONS BY CONVERSION OF AN AMORPHOUS LAYER, there is described a technique for producing a silicon layer on a substrate, which is shown in the patent as a silicon substrate. In the method described in this patent, an amorphous silicon layer is first deposited on the substrate, after which an ion implantation is performed to damage the interface between the amorphous silicon layer and the substrate. After the ion implantation the wafer is annealed to promote the conversion of the amorphous silicon to a monocrystalline layer. This technique has not been successfully applied to produce device quality SOS wafers.

SUMMARY OF THE INVENTION

In accordance wih the illustrated preferred embodiments, the present invention provides a new method for producing a monocrystalline layer of silicon on a sapphire substrate. In this method a monocrystalline layer of silicon is first epitaxially deposited on the sapphire substrate to form a layer which has a substantially perfect crystalline structure near its surface, but which exhibits a large number of lattice defects near the sapphire substrate. An ion implantation step is then performed to form an amorphous region in the imperfect silicon layer near the silicon-sapphire interface. This formation of a selective amorphous region is facilitated by orientation of the ion beam parallel to the major crystal axis of the silicon layer. The implanted ions are therefore "channeled" through the silicon crystal so that the amorphous region will tend to be localized in the high defect region (i.e. near the silicon-sapphire interface), leaving the upper region of the silicon relatively undamaged. One or more annealing steps are then performed during which the amorphous region is converted into monocrystalline form by regrowing the silicon from the "good" monocrystalline upper region of the silicon layer down to the silicon-sapphire interface. In SOS structures produced in this manner the sensitivity of the final epitaxial silicon layer to the silicon-sapphire interface properties is greatly reduced, enabling a high quality silicon layer to be produced on a sapphire substrate.

DETAILED DESCRIPTION OF THE INVENTION

Figure 1:
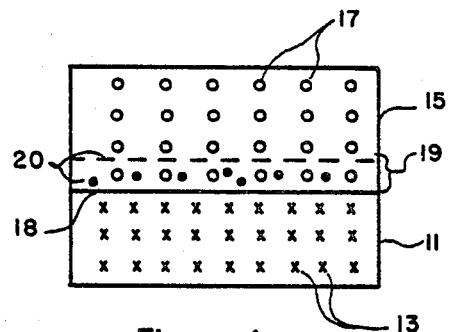
FIG. 1 shows a sapphire wafer having a silicon layer epitaxially deposited thereon.

In FIG. 1 there is illustrated a sapphire substrate 11. The monocrystalline structure of the sapphire is illustrated schematically by a regular pattern of "x's", several of which are labeled 13. A silicon layer 15 is formed on sapphire substrate 11, preferably by epitaxial deposition processes such as are well known in the art, and which will be described more particularly in the examples below. The monocrystalline nature of silicon layer 15 is shown by the orderly lattice structure represented by several rows of "circles," some of which are labeled 17. The lattice spacing of sapphire substrate 11 differs sufficiently from the lattice spacing of silicon layer 15 to produce a large number of lattice defects in a region 19 in the vicinity of the silicon-sapphire interface. These defects are illustrated in FIG. 1 by a number of "dots" 20.

Figure 2:
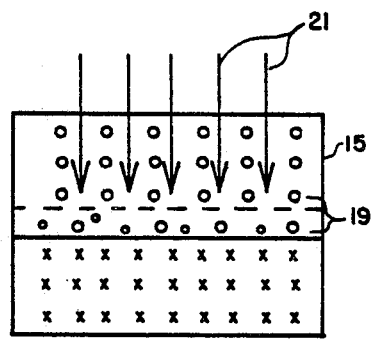
FIG. 2 shows an ion implantation beam channeling into the silicon layer of FIG. 1.
Figure 3:
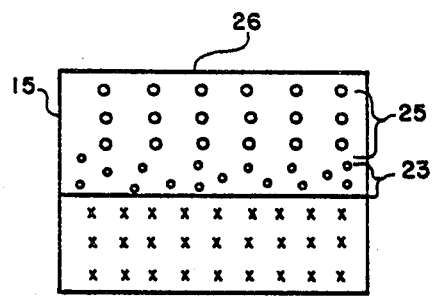
FIG. 3 shows an amorphous region of the silicon layer near the sapphire substrate resulting from the ion implantation.
Figure 4:
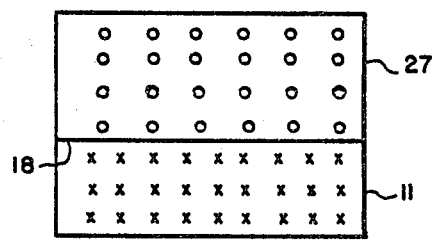
FIG. 4 shows a monocrystalline silicon layer which has been converted from the amorphous silicon by regrowth from the undamaged surface region of the silicon.

In accordance with the principles of the invention, an ion implantation is now performed to form an amorphous region 19 in silicon in region 19. In FIG. 2, a number of arrows 21 schematically represent an implantation of silicon ions into silicon layer 15. The ion implantation is performed in accordance with techniques now well known in the art, with the ion implantation energy being selected so that the ions implanted in silicon layer 15 have a distribution which peaks in region 19. Data describing the implantation distribution as a function of energy and dose may be found generally in the published literature; specific examples are described below. In preferred embodiments the lattice damage is further localized by aligning the implantation beam parallel to the major crystal axis of the silicon layer 15 so that the implanted ions will tend to be "channeled" through silicon layer 15, as indicated by the arrows 21. When the implanted ions arrive at region 19 the ions will be de-channeled and dissipate their energy into the lattice, thereby forming a local amorphous region in the silicon.

After the ion implant there will have been produced a region 23 of amorphous silicon having no well defined crystalline structure. However, in the region 25 extending from region 23 to the top surface 26 of silicon layer 15 the ion implantation beam will have left the crystal largely undamaged. Region 25 will therefore display the well ordered crystal structure characteristic of monocrystalline silicon.

In the next processing step the wafer is subjected to an annealing cycle, during which the silicon previously made amorphous by the ion implant is converted into monocrystalline form by regrowing the silicon from region 25 down toward the silicon-sapphire interface 18. In effect, monocrystalline region 25 serves as a "seed crystal" from which the silicon layer may be regrown down to interface 18. The resulting silicon layer 27 will display a much lower lattice defect density than the original silicon layer which was epitaxially grown on substrate 11.

Some preferred embodiments of the present invention are described in more detail in the following examples:

EXAMPLE 1

An undoped silicon layer is grown heteroepitaxially on a sapphire substrate at approximately 1000C.° by the pyrolisis of silane in hydrogen. A layer about 3000 Å thick is grown in about three (3) minutes. The crystal is grown so that the (100) crystallogrophic direction is within 2° of the surface normal. The SOS wafer so obtained is placed in an ion implantation machine so that its crystal axis is parallel to the implantation beam direction. A beam of silicon ions is directed into the wafer, the beam energy being selected so that the maximum range of the implant is close to the silicon-sapphire interface; for a Silicon layer of 3000 Å thickness, an ion implant beam energy of approximately 180 Kev is appropriate. During the implant the temperature of the sapphire substrate is kept below about 100° C. To create an amorphous layer, a dose of approximately $10^{16}$ ions/cm$^2$ is required. An amorphous layer is formed which extends a distance of about 2000 Å from the silicon-sapphire interface. A monocrystalline layer of silicon about 1000 Å thick extending from the amorphous region to the upper surface of the silicon is left relatively undamaged.

After the ion implant is completed the wafer is removed to a furnace where it is annealed in an inert ambient of either N$_2$ or Argon at 600° C. for about sixty (60) minutes, followed by another anneal in the same ambient at 900° C. for about fifteen (15) minutes. During the annealing cycles the silicon layer regrows down from the undamaged surface crystal toward the sapphire substrate, which produces a good quality single crystal of silicon in intimate contact with the sapphire substrate.

EXAMPLE 2

A silicon layer is grown as in Example 1, but growth is continued until an epitaxial layer about 6000 Å is obtained. For this thickness, multiple ion implant energies of 550 Kev and 360 Kev and total doses of about $10^{15}$ to $10^{16}$ ions cm$^{-2}$ are required to form an amorphous region in the silicon near the substrate. An amorphous layer is formed which extends a distance of about 4000 Å from the silicon-sapphire interface. A monocrystalline layer of silicon about 2000 Å thick extending from the amorphous region to the upper surface of the silicon is left relatively undamaged. To maintain the sapphire substrate below 100° C., the wafer is cooled using Freon or liquid Nitrogen.

EXAMPLE 3

A silicon layer is grown, implanted and regrown as in Examples 1 or 2. Then the silicon surface is ion implanted with a silicon ion beam of about 40 to 80 Kev of implant energy, and a dose of about $10^{16}$ ions cm$^{-2}$. This implant renders the unregrown surface layer amorphous. Then the same anneal sequence described in Example 1 can be performed to regrow the surface region using the already regrown silicon as a seed. This procedure further improves the quality of the silicon layer.

We claim:

1. A method for producing a silicon-on-sapphire wafer having a silicon layer on a sapphire substrate said method comprising the steps of:

epitaxially depositing a layer of monocrystalline silicon on the sapphire substrate;

performing an ion implantation into the silicon layer to form an amorphous region in the silicon layer near the surface of the sapphire substrate, but leaving substantially monocrystalline silicon in another region extending from the amorphous region to the surface of the silicon layer; and annealing the wafer to convert the amorphous silicon to monocrystalline silicon by regrowing the silicon from the remaining substantially monocrystalline silicon region toward the surface of the sapphire substrate.

2. A method as in claim 1 wherein:
the ion implantation beam comprises a beam of silicon ions.

3. A method as in claim 1 wherein:
the ion beam energy is selected to produce an implant having a maximum range lying near the interface between the silicon layer and the sapphire substrate.

4. A method as in claim 3 wherein:
the ion beam is directed along the crystal axis of the silicon layer to channel the ions through the monocrystalline silicon to form an amorphous region in the silicon layer near the sapphire substrate, but leaving substantially monocrystalline silicon in another region extending from the amorphitized region to the surface of the silicon layer.

5. A method as in claim 4, further comprising the steps of:

performing a second ion implantation to render amorphous the surface layer of silicon which was left in a substantially monocrystalline state after the first ion implantation; and performing a second annealing step to convert the surface amorphous layer to monocrystalline silicon.

6. A method as in claim 1, further comprising the steps of:

performing a second ion implantation to render amorphous the surface layer of silicon which was left in a substantially monocrystalline state after the first ion implantation; and performing a second annealing step to convert the surface amorphous layer to monocrystalline silicon.

* * * * *

UNITED STATES PATENT AND TRADEMARK OFFICE
CERTIFICATE OF CORRECTION

PATENT NO. : 4,177,084
DATED : December 4, 1979
INVENTOR(S) : Silvanus S. Lau, et al.

It is certified that error appears in the above-identified patent and that said Letters Patent are hereby corrected as shown below:

Column 2, line 35, delete "in region 19" and insert --layer 15--.

Signed and Sealed this

Thirteenth Day of May 1980

[SEAL]

Attest:

SIDNEY A. DIAMOND

Attesting Officer

Commissioner of Patents and Trademarks